(12) United States Patent
Schmidt et al.

(10) Patent No.: US 6,782,024 B2
(45) Date of Patent: Aug. 24, 2004

(54) HIGH POWER SEMICONDUCTOR LASER DIODE

(75) Inventors: Berthold Schmidt, Erlenbach/ZH (CH); Susanne Pawlik, Zürich (CH); Achim Thies, Zürich (CH); Christoph Harder, Zürich (CH)

(73) Assignee: Bookham Technology plc, Abingdon (GB)

( * ) Notice: Subject to any disclaimer, the term of this patent is extended or adjusted under 35 U.S.C. 154(b) by 13 days.

(21) Appl. No.: 09/852,994

(22) Filed: May 10, 2001

(65) Prior Publication Data

US 2002/0167982 A1 Nov. 14, 2002

(51) Int. Cl.[7] .................................................. H01S 5/00
(52) U.S. Cl. ........................................... 372/46; 372/45
(58) Field of Search ....................................... 372/43–50

(56) References Cited

U.S. PATENT DOCUMENTS

| | | | | |
|---|---|---|---|---|
| 4,964,135 A | * | 10/1990 | Mitsui et al. | 372/46 |
| 5,280,535 A | * | 1/1994 | Gfeller et al. | 372/46 |
| 5,757,833 A | * | 5/1998 | Arakawa et al. | 372/45 |
| 5,844,931 A | | 12/1998 | Sagawa et al. | 372/45 |
| 5,953,358 A | * | 9/1999 | Ishikawa et al. | 372/46 |
| 6,200,837 B1 | | 3/2001 | Ihn et al. | 438/122 |
| 6,373,875 B1 | * | 4/2002 | Yu et al. | 372/46 |

FOREIGN PATENT DOCUMENTS

EP  0 373 933  12/1989

OTHER PUBLICATIONS

Horie et al., Thermal Rollover Characteristics up to 150° C. of Buried –Stripe Type 980–nm Laser Diodes with a Current Injection Window Delineated by a $Sin_x$ Layer, vol. 12, No. 1. Jan. 2000, pp. 13–15.

European Search Report regarding Application No. 02405380.3 mailed Oct. 6, 2003.

* cited by examiner

Primary Examiner—Quyen Leung
(74) Attorney, Agent, or Firm—Renner, Otto, Boisselle & Sklar, LLP

(57) ABSTRACT

Semiconductor laser diodes, particularly high power AlGaAs-based ridge-waveguide laser diodes, are often used in opto-electronics as so-called pump laser diodes for fiber amplifiers in optical communication lines. To provide the desired high power output and stability of such a laser diode and avoid degradation during use, the present invention concerns an improved design of such a device, the improvement in particular significantly minimizing or avoiding (front) end section degradation of such a laser diode and significantly increasing long-term stability compared to prior art designs. This is achieved by establishing one or two "unpumped end sections" of the laser diode. One preferred way of providing such an unpumped end section at one of the laser facets (10, 12) is to insert an isolation layer (11, 13) of predetermined position, size, and shape between the laser diode's semiconductor material and the usually existing metallization (6).

12 Claims, 4 Drawing Sheets

HIGH POWER SEMICONDUCTOR LASER DIODE

FIELD OF THE INVENTION

The present invention relates to semiconductor laser diodes, particularly to AlGaAs-based laser diodes of high light output power. Such laser diodes are commonly used in opto-electronics, often as so-called pump lasers for fiber amplifiers in the field of optical communication, e.g. for Erbium-doped fiber amplifiers. Specifically ridge-waveguide laser diodes are suited to provide the desired narrow-bandwidth optical radiation with a stable light output power in a given frequency band. Light output power and stability of such laser diodes are of crucial interest and any degradation during normal use must be avoided. The present invention concerns an improved design of such laser diodes, the improvement in particular significantly minimizing or avoiding front facet degradation of such laser diodes at very high light output powers compared to prior art designs.

BACKGROUND AND PRIOR ART

Semiconductor laser diodes of the type mentioned above have, for example, become important components in the technology of optical communication, particularly because such lasers can be used for amplifying optical signals immediately by optical means. This allows to design all-optical fiber communication systems, avoiding any complicated conversion of the signals to be transmitted, which improves speed as well as reliability within such systems.

In one kind of optical fiber communication systems, the laser diodes are used for pumping Erbium-doped fiber amplifiers, so-called EDFAs, which have been described in various patents and publications known to the person skilled in the art. An example of some technical significance are ridge-waveguide laser diodes with a power output of 150 mW or more, whose wavelengths match the Erbium absorption lines and thus achieve a low-noise amplification. Several laser diodes have been found to serve this purpose well and are used today in significant numbers. However, the invention is in no way limited to such laser diodes, but applicable to any ridge-waveguide laser diode.

Generally, laser diode pump sources used in fiber amplifier applications are working in single transverse mode for efficient coupling into single-mode fibers and are mostly multiple longitudinal mode lasers, i.e. Fabry-Perot (or FP) lasers. Three main types are typically being used for Erbium amplifiers, corresponding to the absorption wavelengths of Erbium: InGaAsP at 1480 nm; strained quantum-well InGaAs/AlGaAs laser diodes at 980 nm; and AlGaAs laser diodes at 820 nm.

One of the major problems of semiconductor laser diodes of the types mentioned above is the degradation in the end section area, in particular at the front facet of the laser. This degradation is believed to be caused by uncontrolled temperature increase at the mirror facet regions, especially at high power outputs, which temperature increase in turn is probably caused by unwanted carrier recombination in these regions and heating due to free carrier injection.

Consequently, ways have been sought to prevent this carrier recombination in the laser diode's facet regions. One attempt is described in Itaya et al U.S. Pat. No. 5,343,468. It discloses a compound semiconductor laser diode with a current blocking region formed in one facet portion of the laser structure. Though this design may be advantageous for the kind of laser diodes addressed by Itaya, namely regrown/buried double heterostructure laser diodes, it is not manufacturable for ridge waveguide laser diodes of the kind addressed by the present invention. A further problem occurs when manufacturing AlGaAs laser diodes with a two step epitaxial process. Here, the quick oxidation of Al seriously interferes with the Itaya process and thus makes it rather unsuitable for industrial application Thus, it is the main object of the invention to devise a simple and reliable design for a high power ridge waveguide laser diode which avoids the above-mentioned end section degradation to provide a stable light output power under all operating conditions. Another object is to provide an economical manufacturing method, allowing reliable mass production of such laser diodes.

A still further object is to avoid adding to the complexity of the laser diode structure and to keep the number of additional structural components of the laser diode at a minimum.

THE INVENTION

In brief, to solve the issues addressed above, the present invention creates a ridge waveguide laser diode with so-called unpumped end sections, thus effecting a relaxation of the high stress areas in the vicinity of the laser's facets. An appropriate manufacturing process for defining these unpumped end sections to block the induction of high current density—and therefore stresses—into the end sections forms another aspect of the invention.

A ridge waveguide laser diode structured according to the present invention exhibits an extreme improvement over prior art laser diodes, especially with regard to its long-term stability and reliability, as will be shown.

This significant improvement is effected by just a minor increase in manufacturing complexity so that conventional manufacturing equipment may be used and usual manufacturing processes may be applied. Also, the laser diode itself has the same dimensions as before, thus avoiding any packaging changes or problems.

As briefly mentioned above, the design idea of one or two unpumped end section(s) in a ridge waveguide laser diode is to relax high stress areas close to the laser's facets. Due to a crystal inhomogeneity—often produced by cleaving the laser cavity—and high optical power densities within these regions, especially in the front facet/mirror vicinity, the regions adjacent to the mirrors are believed to be the weakest points within the whole waveguide in terms of reliability.

Particularly in the front facet region, an increased failure rate at very high optical output powers can be observed. The same was found, though to a lesser degree, in the vicinity of the back mirror. Since the material degradation in these high stress region is accelerated by a combination of optical power density and electrical current density, it seems advantageous to reduce the latter. This is effected by establishing one or two unpumped end section(s) according to the present invention.

DETAILED DESCRIPTION OF A PREFERRED EMBODIMENT AND A PROCESS

In the following, an embodiment of the invention shall be described by reference to the drawings, in which.

Generally speaking, the invention aims at reducing the local current density within the laser's end sections to reduce the degradation caused and accelerated by local heating of the laser.

The local current in the end section is—as is the current in other parts of the laser diode—essentially generated by the injection current driving the laser diode. Thus, to reduce the local current density and to finally prevent current flow within the laser diode's end sections, the current injected into these end sections must be reduced. Various processes have been tested, including contact lift-off, removing the contact by etching, or otherwise interrupting the contact around these regions. However, most of the processes tested and realized failed due to material, processing, or reliability problems.

The most successful approach was an "isolation layer" process to achieve the desired unpumped end sections. This approach differs from earlier ones in the way that an additional thin isolation layer is placed between the semiconductor contact layer and the metal contact at the laser diode end sections. The semiconductor contact layer may even be removed.

The advantages are fourfold: the isolation layer provides an effective isolation of the contact layer within this region;

exhibits no negative influence on the cleaving quality;

does not influence the electro-optical properties of the device; and provides a good thermal contact due to the overlaying metal layer.

It was found that it is advantageous to retain the full area metallization as metal contact to provide sufficient cooling, which is particularly important at high power outputs.

It was also found that there are limits to the size, especially the longitudinal extension of the isolation layer:

The minimum longitudinal extension should be greater than the medium diffusion length of the free carriers in the laser diode's semiconductor material. Thus, the minimum length depends on the material characteristics of the semiconductor used.

The maximum length of the isolation layer, on the other hand, is limited by an increase in optical absorption loss commonly reducing the laser diode efficiency.

In the worst case, the P/I characteristic may show beginning inhomogeneities just above laser threshold.

The lateral extension of the isolation layer is given by the structure of the laser diode's ridge and is preferably wider than the latter.

So much for the general considerations.

Figure 1:
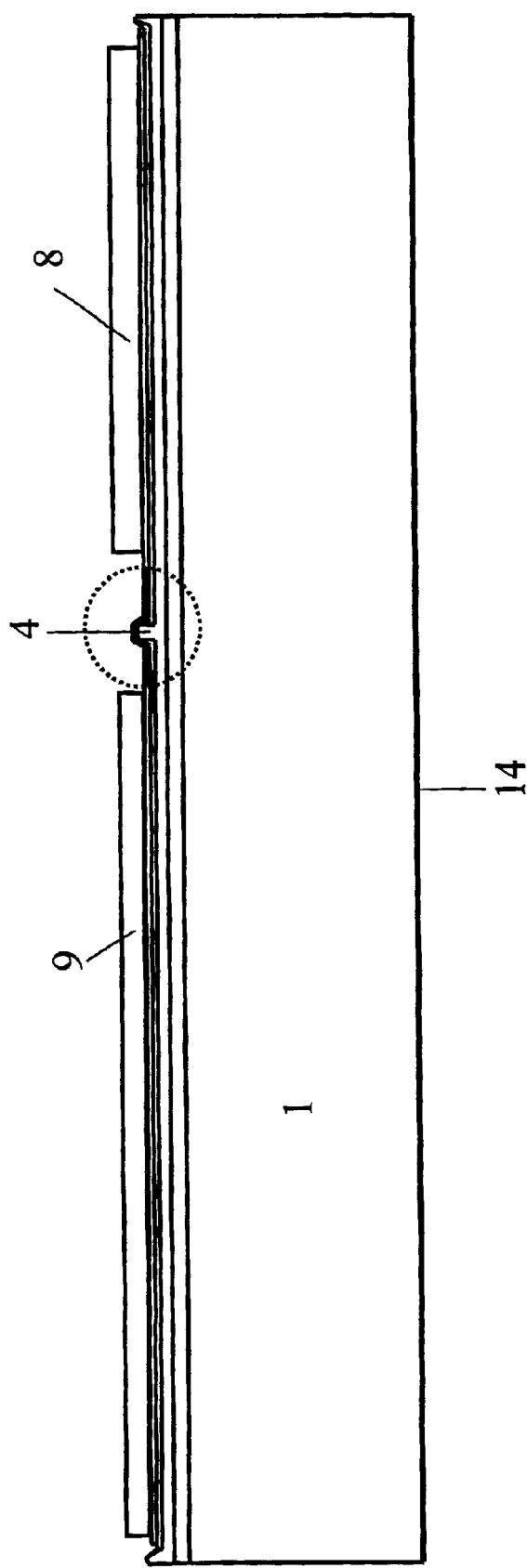
FIG. 1 shows in a front view the general structure of a ridge waveguide laser diode.
Figure 2:
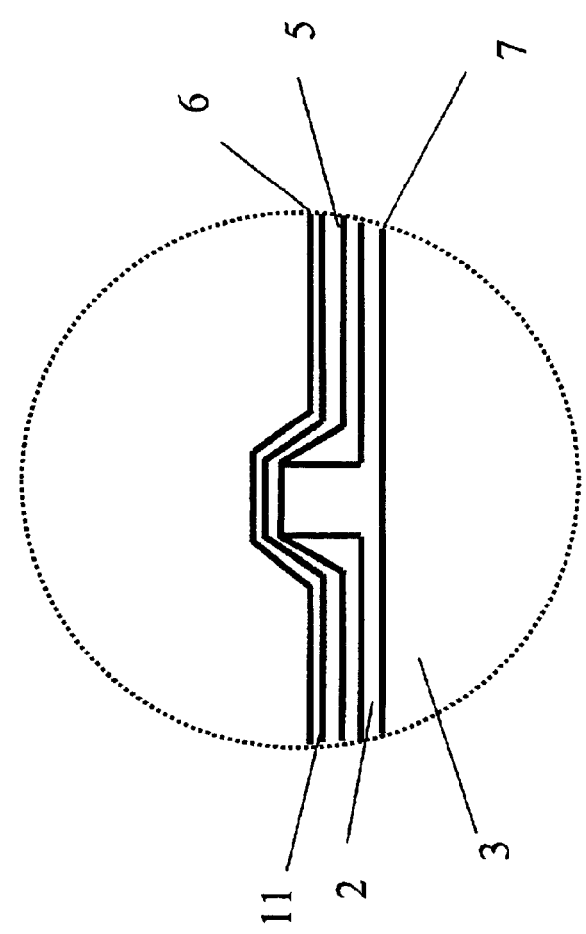
FIG. 2 depicts the laser diode's front facet in an enlarged view.

FIGS. 1 and 2 show the basic layout of an embodiment of the invention, namely an AlGaAs ridge waveguide laser diode in a front view. A semiconductor body, here a GaAs substrate 1, forms the basis for the laser diode.

In principle, the 980 nm pump laser diode consists of a SQW (strained quantum well) active region 7 sandwiched by two AlGaAs cladding layers 2 and 3. The top p-metallization covers the semiconductor ridge waveguide 4 together with the embedding material 5.

At the bottom of the substrate 1 is an n-metallization 14. FIG. 2 further shows the additional isolation layer 11, here made of SiN, between the top metallization 6 and the AlGaAs active region layer 2, extending over the ridge 4.

Figure 4:
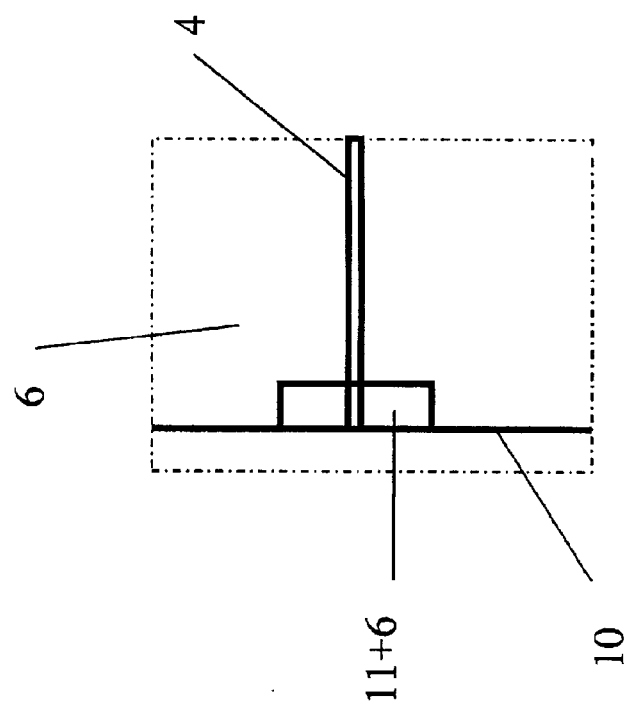
FIG. 4 shows the laser diode's front section enlarged, again in a top view.
Figure 3:
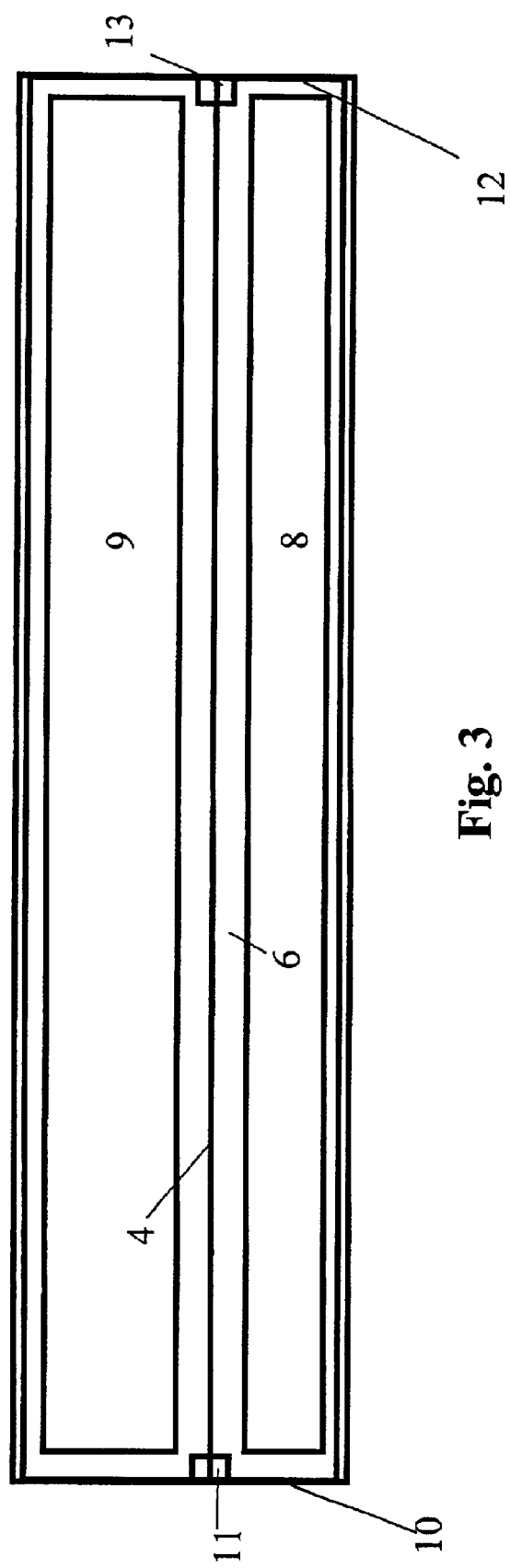
FIG. 3 illustrates, in a top view, the laser diode with its two facets and the unpumped end sections.

The additional isolation layer 11, as shown in FIGS. 3 and 4 and described below, extends longitudinally over only a fraction of the total length of the laser ridge 4. Two ridge protecting layers 8 and 9 cover the remaining surface of the laser diode, protecting it against the environment.

FIGS. 3 and 4 depict a top view of an AlGaAs laser diode according to the invention. The two ridge protecting layers 8 and 9 extend over the whole length of the laser diode, having the ridge 4 between them, the latter being shown as a single line in FIG. 3. Please note that the physical dimensions of such a AlGaAs ridge waveguide laser diode are quite small, about 0.4*1.8 mm with a thickness of about 0.15 mm.

FIG. 4 shows the front facet section of the laser diode enlarged. A front mirror 10 covers the front facet of the laser diode, the p-metallization 6 extending over the ridge 4 and the surrounding area of the laser diode 1. An additional isolation layer 11 is positioned at the end of the ridge 4 under the metallization 6, insulating a small part of this metallization 6 from the laser diode's active region and thus defining the unpumped end section at the laser diode's front end.

As shown in FIG. 3, a back mirror 12 covers the back facet of the laser diode. A second additional isolation layer 13, essentially identical to the layer 11 at the laser diode's front end, may be located there. This layer 13 results in the same blocking effect as at the laser diode's front end. However, this second insulation is not necessary; a large part of the advantages of the invention may already be achieved by a single isolation layer 11 at the laser diode's front end. Also, the reverse arrangement, i.e. an isolation layer only at the laser diode's back end and none at the front end may work advantageously under certain conditions and environments.

The length of the isolation layer 11—and, if applicable, of the second isolation layer 13 at the laser diode's back end—along the waveguide ridge 4 is determined by two limits. It should be at least as long as, preferably longer, than the mean free diffusion length of the free carriers in the active region of the laser diode. On the other hand, a drop in the power/current curve of the laser diode must be avoided which fact limits the maximum length of the isolation layer 11 and/or of the isolation layer 13 at the laser diode's back end.

Figure 5:
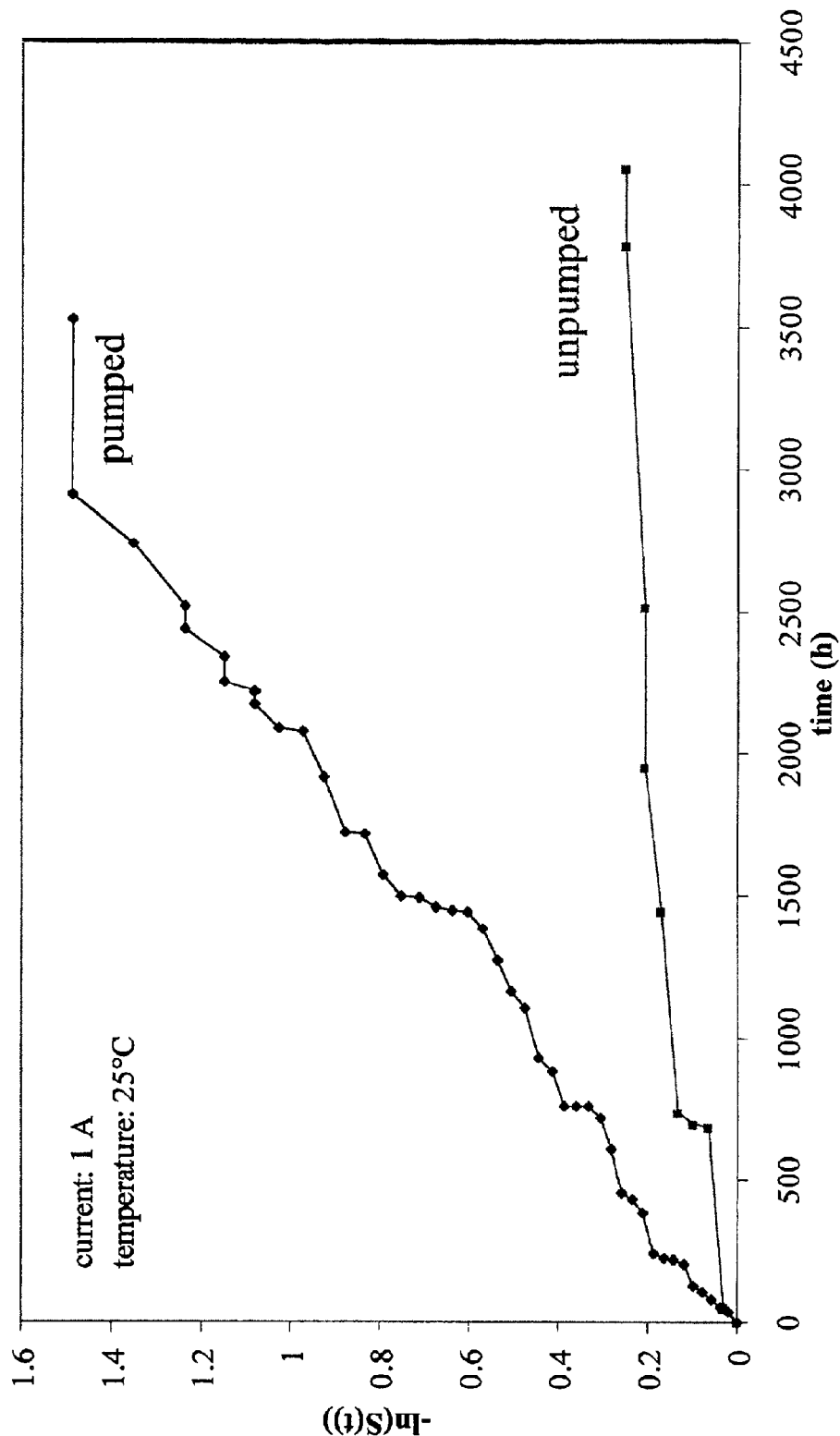
FIG. 5 is a graph illustrating an example of the tremendous lifetime increase comparing a pumped laser diode vs. an unpumped laser diode according to the invention.

FIG. 5 is a graph comparing life time measurements made of a standard ridge waveguide laser diode with a laser diode having unpumped end sections according to the invention. Shown is the function $-\ln(S(t))$, where $S(t)$ is the survival function or survival fraction commonly describing the fraction of the population expected to survive until time t, ($S(t)=n(t)/n(0)$). The difference between the two curves is striking. The standard "pumped" laser diode shows an 10 times higher failure rate compared to the "unpumped" laser diode at high power condition, here 1 A injection current and 25° C. temperature. At that temperature and injection current, single mode laser diodes emit around 800 mW light output power.

In the following, a way of manufacturing a laser diode with unpumped end sections according to the invention is described.

Essentially, this process is realized by introducing one or more patterned isolation layers as shown in FIGS. 3 and 4 between the laser semiconductor and the p-metallization. The preferred way is to form appropriate patterns by in-situ controlled dry chemical reactive ion etch back of a PECV (plasma enhanced chemical vapor) deposited SiN layer. Alternatively, a sputtering process may also be used.

Usually, several hundred laser diodes of the kind described here are fabricated on a semiconductor wafer.

After embedding the ridge waveguide, except for the contact layer, with isolating material (here SiN), an about 50 nm thin SiN isolating layer is PECV deposited on the whole wafer. Other materials like $SiO_2$, $Al_2O_3$, or TiN and thicknesses may also be used. The patterning is defined in a photolitographical step in a way that 20 $\mu$m×40 $\mu$m rectangles of remaining resist are realized above the region forming the (unpumped) end section(s) later on. The resist is used as a mask for the following dry chemical etch process. Later, the resist is stripped by using organic solvents and water, as usual. The manufacturing process then continues with the standard p-metallization processing and the subsequent steps known to a person skilled in the art.

Additional advantages and modifications will readily occur to persons skilled in the art and the invention is therefore not limited to the specific embodiments, details, and steps shown and described hereinbefore. Modifications may be made without departing from the spirit and scope of the general inventive concepts as defined in the appended claims.

What is claimed is:

1. A semiconductor ridge waveguide laser diode including
   a semiconductor body,
   an active region including a ridge waveguide with dimensionally unconstricted end sections,
   front and back facets dosing said end sections, each with a mirror,
   a metallization over said body and said ridge for injecting carriers into said active region, and
   means for limiting said injection of carriers at one of said end sections, thus providing at least one unpumped end section,
   said limiting means comprising an isolation layer whose lateral extension is wider than the laser's waveguide ridge, but smaller than said metallization's lateral extension.

2. The laser diode according to claim 1, wherein
   two means for limiting the injection of carriers are provided, one each at the front and the back end section of the laser diode.

3. The laser diode according to claim 1, wherein
   the isolation layer between the laser diode's active region and the metallization is made from $SiO_2$, $Al_2O_3$, TIN or SiN.

4. The laser diode according to claim 1, wherein the isolation layer is extending under only a fraction of the area of the metallization.

5. The laser diode according to claim 1, wherein
   the isolation layer is about 50 nm thin.

6. The laser diode according to claim 1, wherein
   the isolation layer's longitudinal extension is at least as long as the mean diffusion lengths of the free carriers within the laser's active region.

7. The laser diode according to claim 1, wherein
   the laser diode substrate is GaAs,
   the active region is AlGaAs/InGaAs, and
   the isolation layer is SIN.

8. The laser diode according to claim 1, wherein
   the isolation layer's longitudinal extension is longer than the mean diffusion lengths of the free carriers within the laser's active region.

9. The laser diode according to claim 1, wherein the isolation layer covers an area of approximately 20 $\mu$m×40 $\mu$m.

10. The laser diode according to claim 1, wherein
    a single isolation layer is provided, placed over the front end section of the ridge waveguide.

11. The laser diode according to claim 1, wherein
    at least one isolation layer is shorter in length and narrower in width than the metallization.

12. The laser diode according to claim 1, wherein
    two isolation layers of the same shape and/or size are provided.

* * * * *